(12) United States Patent
Loopstra et al.

(10) Patent No.: US 10,146,142 B2
(45) Date of Patent: *Dec. 4, 2018

(54) LITHOGRAPHIC APPARATUS AND DEVICE MANUFACTURING METHOD

(71) Applicant: ASML NETHERLANDS B.V., Veldhoven (NL)

(72) Inventors: Erik Roelof Loopstra, Eindhoven (NL); Johannes Jacobus Matheus Baselmans, Oirschot (NL); Marcel Mathijs Theodore Marie Dierichs, Venlo (NL); Johannes Christiaan Maria Jasper, Veldhoven (NL); Matthew Lipson, Stamford, CT (US); Hendricus Johannes Maria Meijer, Veldhoven (NL); Uwe Mickan, Veldhoven (NL); Johannes Catharinus Hubertus Mulkens, Maastricht (NL); Tammo Uitterdijk, De Bilt (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/419,769

(22) Filed: Jan. 30, 2017

(65) Prior Publication Data

US 2017/0160650 A1 Jun. 8, 2017

Related U.S. Application Data

(63) Continuation of application No. 13/903,885, filed on May 28, 2013, now Pat. No. 9,606,448, which is a
(Continued)

(30) Foreign Application Priority Data

Aug. 29, 2003 (EP) ..................................... 03255377

(51) Int. Cl.
*G03B 27/52* (2006.01)
*G03F 7/20* (2006.01)

(52) U.S. Cl.
CPC ........ *G03F 7/70866* (2013.01); *G03F 7/7015* (2013.01); *G03F 7/70341* (2013.01); *Y10S 430/162* (2013.01)

(58) Field of Classification Search
CPC . G03F 7/70341; G03F 7/70925; G03F 7/7015
(Continued)

(56) References Cited

U.S. PATENT DOCUMENTS 3,573,975 A     4/1971   Dhaka et al.
3,648,582 A *   3/1972   Nerwin .................. G03B 19/04
                                                                                        396/375
(Continued)

FOREIGN PATENT DOCUMENTS

DE     206 607     2/1984
DE     221 563     4/1985
(Continued)

OTHER PUBLICATIONS

M. Switkes et al., "Immersion Lithography at 157 nm", MIT Lincoln Lab, Orlando Jan. 2001, Dec. 17, 2001.
(Continued)

*Primary Examiner* — Hung Henry Nguyen
(74) *Attorney, Agent, or Firm* — Pillsbury Winthrop Shaw Pittman LLP

(57) ABSTRACT

A lithographic projection apparatus is disclosed for use with an immersion liquid positioned between the projection system and a substrate. Several methods and mechanism are disclosed to protect components of the projection system, substrate table and a liquid confinement system. These include providing a protective coating on a final element of the projection system as well as providing one or more
(Continued)

sacrificial bodies upstream of the components. A two component final optical element of $CaF_2$ is also disclosed.

20 Claims, 4 Drawing Sheets

Related U.S. Application Data continuation of application No. 13/240,753, filed on Sep. 22, 2011, now Pat. No. 8,804,097, which is a continuation of application No. 11/529,587, filed on Sep. 29, 2006, now Pat. No. 8,208,124, which is a continuation of application No. 10/927,531, filed on Aug. 27, 2004, now Pat. No. 8,208,123.

(58) Field of Classification Search
USPC .......................................... 355/30, 53, 67, 71
See application file for complete search history.

(56) References Cited

U.S. PATENT DOCUMENTS

| | | |
|---|---|---|
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,121,256 A | 6/1992 | Corle et al. |
| 5,610,683 A * | 3/1997 | Takahashi ............ G03F 7/70341 355/53 |
| 5,715,039 A | 2/1998 | Fukuda et al. |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. ....................... 369/112 |
| 6,466,365 B1 | 10/2002 | Maier et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,788,477 B2 | 9/2004 | Lin |
| 6,952,253 B2 | 10/2005 | Lof et al. |
| 6,954,256 B2 | 10/2005 | Flagello et al. |
| 7,009,682 B2 | 3/2006 | Bleeker |
| 7,050,146 B2 | 5/2006 | Duineveld et al. |
| 7,075,616 B2 | 7/2006 | Derksen et al. |
| 7,081,943 B2 | 7/2006 | Lof et al. |
| 7,187,503 B2 | 3/2007 | Rostalski et al. |
| 7,193,232 B2 | 3/2007 | Lof et al. |
| 7,199,858 B2 | 4/2007 | De Smit et al. |
| 7,215,410 B2 | 5/2007 | Sumiyoshi |
| 7,326,522 B2 | 2/2008 | Dierichs |
| 7,359,030 B2 | 4/2008 | Simon et al. |
| 7,394,521 B2 | 7/2008 | Van Santen et al. |
| 7,545,481 B2 | 6/2009 | Streefkerk et al. |
| 7,589,818 B2 | 9/2009 | Mulkens et al. |
| 7,697,111 B2 | 4/2010 | Shirai et al. |
| 8,189,170 B2 | 5/2012 | Shirai et al. |
| 8,208,124 B2 | 6/2012 | Loopstra et al. |
| 9,606,448 B2 * | 3/2017 | Loopstra ............ G03F 7/70341 |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2003/0137733 A1 | 7/2003 | Gerhard et al. |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. ................... 359/649 |
| 2004/0119954 A1 | 6/2004 | Kawashima et al. |
| 2004/0125351 A1 | 7/2004 | Krautschik et al. |
| 2005/0213066 A1 | 9/2005 | Sumiyoshi |
| 2006/0023183 A1 | 2/2006 | Novak et al. |
| 2008/0068573 A1 | 3/2008 | Omura et al. |
| 2014/0347642 A1 | 11/2014 | Loopstra et al. |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 0 605 103 | 7/1994 |
| EP | 1039511 | 9/2000 |
| EP | 1 316 849 | 6/2003 |
| EP | 1 420 300 | 5/2004 |
| EP | 1 429 190 | 6/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2000-614504 | 7/2000 |
| JP | 2001-091849 | 4/2001 |
| JP | 2004-193252 | 7/2004 |
| JP | 2004-259966 | 9/2004 |
| JP | 2004-320016 | 11/2004 |
| JP | 2004-356205 | 12/2004 |
| JP | 2005-026634 | 1/2005 |
| JP | 2005-202375 | 7/2005 |
| JP | 2005-268741 | 9/2005 |
| JP | 2005-286026 | 10/2005 |
| JP | 2007-502539 | 2/2007 |
| JP | 2010-093299 | 4/2010 |
| WO | 99/49504 | 9/1999 |
| WO | 02/093209 | 11/2002 |
| WO | 03/077034 | 9/2003 |
| WO | 03/077036 | 9/2003 |
| WO | 03/077037 | 9/2003 |
| WO | 2004/019128 | 3/2004 |
| WO | 2004/053596 | 6/2004 |
| WO | 2004/053950 | 6/2004 |
| WO | 2004/053951 | 6/2004 |
| WO | 2004/053952 | 6/2004 |
| WO | 2004/053953 | 6/2004 |
| WO | 2004/053954 | 6/2004 |
| WO | 2004/053955 | 6/2004 |
| WO | 2004/053956 | 6/2004 |
| WO | 2004/053957 | 6/2004 |
| WO | 2004/053958 | 6/2004 |
| WO | 2004/053959 | 6/2004 |
| WO | 2004/055803 | 7/2004 |
| WO | 2004/057589 | 7/2004 |
| WO | 2004/057590 | 7/2004 |
| WO | 2005/020298 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

(56) References Cited

OTHER PUBLICATIONS

G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol, B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, J. Microlith., Microfab., Microsyst. 1(1):7-12 (2002).
European Search Report for EP 03255377.8, dated Aug. 6, 2004.
Search Report for European Application No. EP 04254940.2, dated Nov. 9, 2004.
Search Report for European Application No. EP 04254940.2, dated Nov. 17, 2004.
Search Report for European Application No. EP 04254940.2, dated Feb. 18, 2005.
Korean Official Action issued for Korean Patent Application No. 10-2004-0067737, dated May 26, 2006, and English language translation thereof.
Japanese Office Action dated Nov. 15, 2011 in corresponding Japanese Patent Application No. 2010-081728.
Japanese Office Action dated Jul. 2, 2013 in corresponding Japanese Patent Application No. 2012-111485.
U.S. Office Action dated Dec. 11, 2013 in corresponding U.S. Appl. No. 13/240,753.
U.S. Office Action dated Jan. 13, 2016 in corresponding U.S. Appl. No. 14/456,845.

* cited by examiner

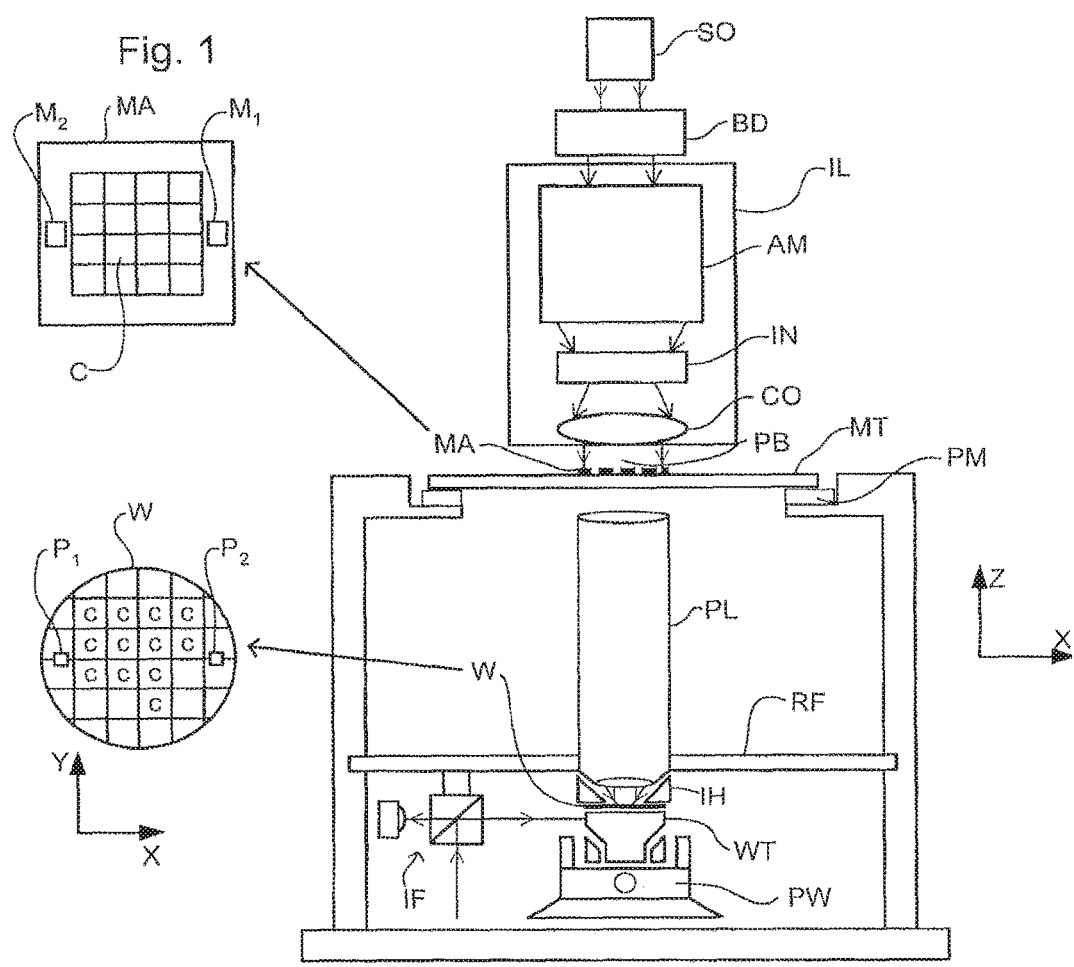

– PRIOR ART – Fig. 2
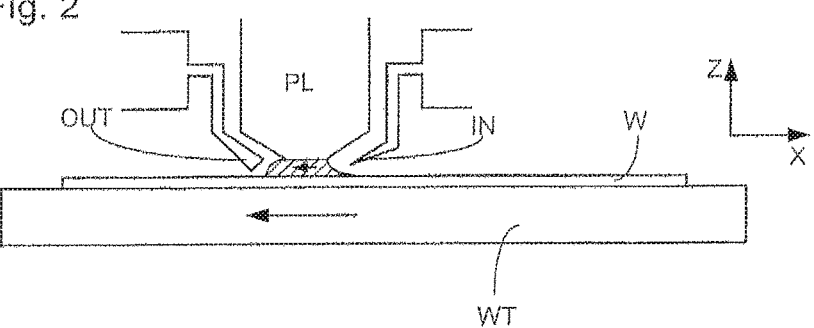
– PRIOR ART – Fig. 3
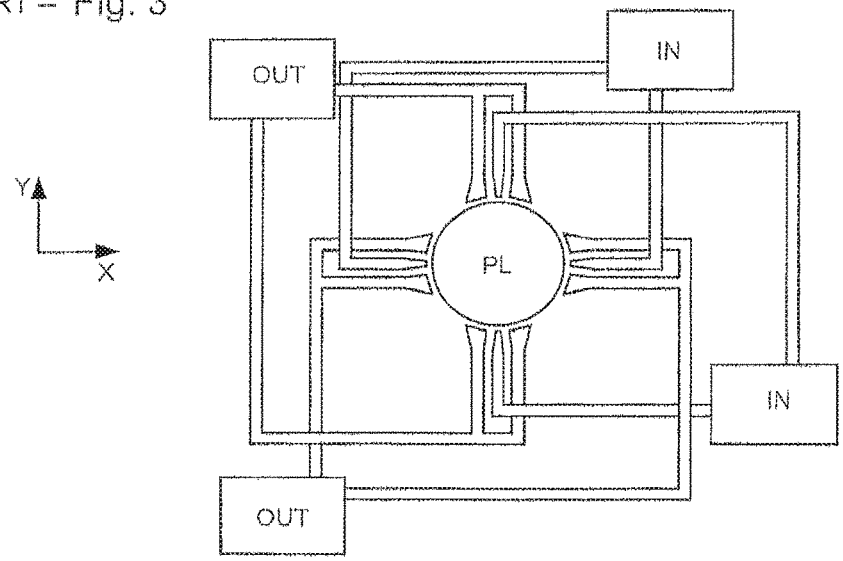
Fig. 4
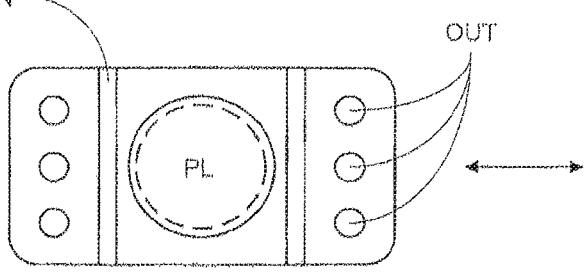
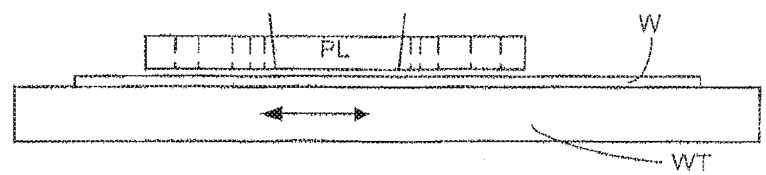

LITHOGRAPHIC APPARATUS AND DEVICE MANUFACTURING METHOD

This application is a continuation of U.S. patent application Ser. No. 13/903,885, filed May 28, 2013, now U.S. Pat. No. 9,606,448, which is a continuation application of U.S. patent application Ser. No. 13/240,753, filed Sep. 22, 2011, now U.S. Pat. No. 8,804,097, which is a continuation application of U.S. patent application Ser. No. 11/529,587, filed Sep. 29, 2006, now U.S. Pat. No. 8,208,124, which is a continuation application of U.S. patent application Ser. No. 10/927,531, filed Aug. 27, 2004, now U.S. Pat. No. 8,208,123, which claims priority from European patent application no. EP 03255377.8, filed Aug. 29, 2003, each of the foregoing applications incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

The use of immersion liquid in the space between the final element of the projection system and the substrate means that the final element of the projection system (e.g., an 'abschlussplatte' which seals the projection system, or the final optical element of the projection system) and substrate table are in contact with the immersion liquid. This can lead to problems with reaction or dissolution in the immersion liquid of the components of the projection system or substrate table.

Accordingly, it would be advantageous, for example, to provide a lithographic projection apparatus in which degradation of components, because of contact with immersion liquid, is reduced.

According to an aspect of the invention, there is provided a lithographic projection apparatus arranged to project a pattern from a patterning device onto a substrate using a projection system and having a liquid supply system configured to at least partly fill a space between the projection system and the substrate with a liquid, wherein an element of the projection system through which the pattern is projected has, on a surface configured to be in contact with the liquid, a protective coating which is substantially insoluble in the liquid.

In this way, for example, the final element of the projection system may be made of a material which is selected due to superior optical properties and considerations regarding the activity between the material of the element and the immersion liquid do not need to be taken into account. If the thickness of the protective coating is kept low, the effect of the protective coating on the projection beam may be minimized.

In an embodiment, the protective coating is a metal, a metal oxide or nitride e.g. TiN, diamond, DLC or $SiO_2$. These materials are both transparent to projection beam radiation used in immersion lithography as well as insoluble or inert in the immersion liquid, which in an embodiment comprises substantially water.

According to an aspect of the invention, there is provided a lithographic projection apparatus arranged to project a pattern from a patterning device onto a substrate using a projection system and having a liquid supply system configured to at least partly fill a space between the projection system and the substrate with a liquid, wherein the liquid supply system is configured to provide a first liquid in the space in contact with an element of the projection system through which the pattern is projected and to provide a second liquid in the space in contact with the substrate.

This arrangement may allow a first immersion liquid to be chosen such that the material of the final element of the projection system is insoluble (and/or inert) in that liquid. On the other hand, a second immersion liquid, different from the first, may be selected such that it has the correct optical properties or otherwise as required. In an embodiment, the first and second liquids are kept apart so that it can be ensured that only the first liquid is in contact with the element.

In an embodiment, the liquid supply system has a membrane configured to separate the first and second immersion liquids. This is one of many ways in which the two immersion liquids can be arranged to be correctly constrained relative to the final element and the substrate. Material of which the membrane could be made includes quartz, which, in an embodiment, may be between 0.1 and 5 mm thick. In this way, for example, the final element of the projection system may be protected from the second immersion liquid with only a small adverse effect to the quality of the projection beam. Other solutions are possible.

According to an aspect of the invention, there is provided a lithographic projection apparatus arranged to project a pattern from a patterning device onto a substrate using a projection system and having a liquid supply system configured to at least partly fill a space between the projection system and the substrate with a liquid, wherein an element of the projection system through which the pattern is to be projected and configured to be at least in part in contact with the liquid, comprises first and second components of $CaF_2$, $SiO_2$ or a combination of both materials, the components being arranged such that the projected pattern passes through the first component before passing through the second component.

In this arrangement it is typically the last optical element with optical power and/or the abschlussplatte which is referred to. In this way the good optical properties of $CaF_2$ may be harnessed because a second component of $CaF_2$ can be used to cancel out the effect of the intrinsic birefringence of a first component of $CaF_2$. One way of doing this is to provide the first and second components with crystal axes aligned such that the intrinsic birefringence of the first component is compensated for by the intrinsic birefringence of the second component.

In an embodiment, the first and second components are concentric. This is a compact geometry in which the optical paths through the first component are substantially of equal length to those through the second component. In this arrangement the second component may be positioned substantially within a recess in the first component such that if the final lens element is substantially of hemispherical shape the second lens component is substantially hemispherical in shape and the first component is also substantially of hemispherical shape though with a (substantially hemispherical) recess in the non-spherical surface.

In an embodiment, only the final element of the projection system is made of $CaF_2$ and the other elements of the projection system can be made of materials other than $CaF_2$.

According to an aspect of the invention, there is provided a lithographic projection apparatus arranged to project a pattern from a patterning device onto a substrate using a projection system and having a liquid supply system configured to at least partly fill a space between the projection system and the substrate with a liquid, wherein the liquid supply system comprises a sacrificial body, in the liquid upstream of the space, configured to dissolve in the liquid to reduce the rate of dissolution of (a) the projection system, (b) the substrate table, (c) the liquid supply system, or any combination of (a), (b), and (c).

This aspect works by the sacrificial body dissolving in the immersion liquid to reduce the activity of the immersion liquid on components downstream of the sacrificial body. For example, if the sacrificial body is made of the same material as the component it is to protect, the immersion liquid becomes substantially saturated in the material of the sacrificial body such that no more such material can be dissolved by the immersion liquid and the component made of that material is thereby protected. One example of such material is quartz.

If the sacrificial body is of a shape with a high surface area to volume ratio (e.g. rods, tubing, fibers), it will dissolve particularly quickly in the immersion liquid which is advantageous.

According to an aspect of the invention, there is provided a device manufacturing method comprising projecting a patterned beam of radiation onto a substrate through a liquid provided in a space between an element of a projection system and the substrate, wherein a surface of the element in contact with the liquid comprises a protective coating which is substantially insoluble in the liquid.

According to an aspect of the invention, there is provided a device manufacturing method comprising projecting a patterned beam of radiation onto a substrate through a first liquid and a second liquid provided in a space between an element of a projection system and the substrate, wherein the first liquid is in contact with the element and the second liquid is in contact with the substrate.

According to an aspect, there is provided a device manufacturing method comprising projecting a patterned beam of radiation onto a substrate through a liquid provided in a space between an element of a projection system and the substrate, wherein the element is at least in part in contact with the liquid and comprises first and second components of $CaF_2$, $SiO_2$ or a combination of both materials, the components being arranged such that the patterned beam of radiation passes through the first component before passing through the second component.

According to an aspect, there is provided a device manufacturing method comprising projecting a patterned beam of radiation onto a substrate through a liquid provided in a space between an element of a projection system and the substrate, wherein a sacrificial body, in the liquid upstream of the space, dissolves in the liquid to reduce the rate of dissolution of a component of (a) the projection system, (b) a substrate table holding the substrate, (c) a liquid supply system providing the liquid, or any combination of (a), (b), and (c).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIGS. 2 and 3 depict a liquid supply system for use in a lithographic projection apparatus;

FIG. 4 depicts another liquid supply system for use in a lithographic projection apparatus;

DETAILED DESCRIPTION

Figure 5:
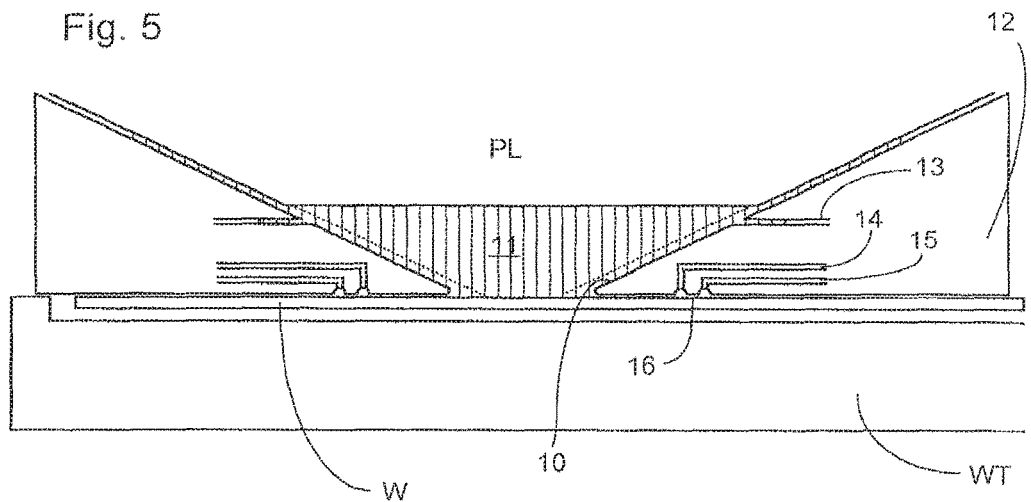
FIG. 5 depicts a further liquid supply system according to an embodiment of the invention.

FIG. 1 schematically depicts a lithographic apparatus according to one embodiment of the invention. The apparatus comprises:
- an illumination system (illuminator) IL configured to condition a radiation beam PB (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Another solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such as system with a gas seal is disclosed in U.S. patent application Ser. No. 10/705,783, hereby incorporated in its entirety by reference.

FIG. 5 shows a liquid reservoir 10 between the projection system PL and a substrate W which is positioned on the substrate stage WT. The liquid reservoir 10 is filled with a liquid 11 having a relatively high refractive index, e.g. water, provided via inlet/outlet ducts 13. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms, in an embodiment, a contactless seal to the substrate W around the image field of the projection system PL so that the liquid is confined to fill the space between the substrate's primary surface, which faces the projection system PL, and the final element (e.g. an 'abschlussplatte' which seals the projection system, or the final optical element of the projection system) of the projection system PL. The reservoir is formed by a seal member 12 positioned below and surrounding the final element of the projection system PL. Thus, the liquid supply system provides liquid on only a localized area of the substrate. The seal member 12 forms part of the liquid supply system for filling the space between the final element of the projection system and the substrate W (or, e.g., a sensor) with a liquid. This liquid is brought into the space below the projection system and within the seal member 12. The seal member 12 extends a little above the bottom element of the projection system and the liquid rises above the final element so that a buffer of liquid is provided. The seal member 12 has an inner periphery that at the upper end closely conforms to the shape of the projection system or the final element thereof and may, e.g. be round. At the bottom the inner periphery forms an aperture which closely conforms to the shape of the image field, e.g. rectangular, though this is not necessarily so. The projection beam passes through this aperture.

The liquid 11 is confined in the reservoir 10 by a seal device 16. As illustrated in FIG. 5, the seal device is a contactless seal, i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

FIGS. 2 and 3 also depict a liquid reservoir defined by inlet(s) IN, outlet(s) OUT, the substrate W and the final element of projection system PL. Like the liquid supply system of FIG. 5 the liquid supply system illustrated in FIGS. 2 and 3, comprising inlet(s) IN and outlet(s) OUT, supplies liquid to a space between the final element of the projection system and a localized area of the primary surface of the substrate.

Both of the liquid supply systems of FIGS. 2 & 3 and FIG. 5 as well as other solutions, such as a bath in which the substrate W or whole substrate table WT is immersed and the liquid supply system of FIG. 4 described hereafter, may be used with the present invention described below.

Figure 6:
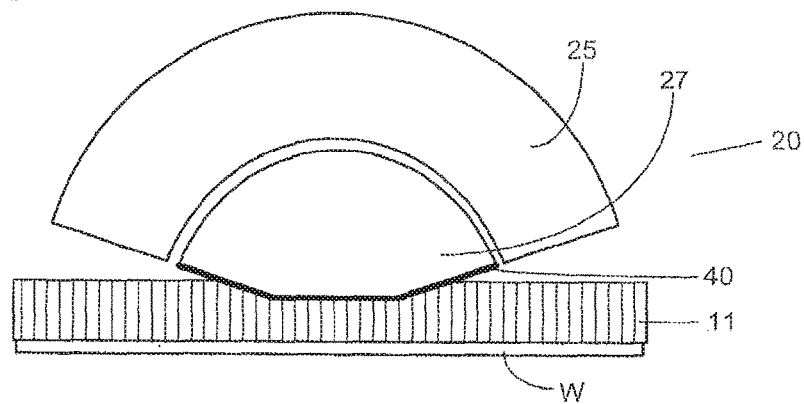
FIG. 6 depicts a final element of the projection system with a protective coating.

FIG. 6 illustrates in detail the final element 20 of the projection system PL. In the embodiment illustrated in FIG. 6 the final element is a final optical element 20 which comprises a first component 25 and a second component 27. The final element 20 of the projection system PL comprises first and second components 25, 27 so that the element may be made of a material which exhibits birefringence. An example material for irradiation at 157 nm is $CaF_2$ which is transmissive but exhibits birefringence properties at this wavelength. Quartz is barely transmissive at 157 nm. $CaF_2$ is also useful for 193 nm although quartz can also be used at this wavelength. However, quartz lenses suffer from compaction at these wavelengths which can cause radiation to be focused on to small bits of the lens which discolor (go dark) and absorb more heat and so a channel can get cut.

By providing the final element 20 as first and second components or parts, the birefringence exhibited by $CaF_2$ at 157 nm can be compensated for by ensuring that the crystal orientations of the first and second components are aligned such that the intrinsic birefringence exhibited by the first component 25 is cancelled or reduced by the intrinsic birefringence exhibited by the second component 27. In this way, the projection beam PB which passes first through the first component 25 and then through the second component 27 exits the second component 27 substantially free of birefringence phenomena.

The remaining optical elements of the projection system PL may be comprised of materials other than $CaF_2$. The intensity of the projection beam is highest at the last element which is also the smallest so that it is this element which is most likely to suffer from compaction if made of quartz.

As illustrated in FIG. 6, the final element 20 of the projection system PL is substantially hemispherical in shape. Thus, the second component 27 is in the shape of a hemisphere and is positioned in a recess of the first component 25 which has an outer surface of the shape of a hemisphere with a recess in its non-curved surface.

$CaF_2$ may dissolve or react with immersion liquid 11 used in an immersion liquid lithographic projection apparatus. Presently the immersion liquid is envisaged as comprising substantially water for 248 nm and 193 nm. For 157 nm, perfluouro-hydrocarbons are envisaged.

One way of protecting the final element 20 of the projection system from attack by the immersion liquid 11 is to provide a protective coating 40 on a surface of the final element 20 which is in contact with the immersion liquid. In an embodiment, the material of the protective coating 40 is inert in the immersion liquid 11 and does not dissolve. As is illustrated in FIG. 6, the protective coating 40 is attached to the bottom (as illustrated) surface of the second component 27 of the projection system PL.

In an embodiment, the protective layer is made as thin as possible while still providing protection to the final optical element 20 of the projection system PL. In an embodiment, the protective coating is between 5 and 500 nm thick, or between 10 and 200 nm thick. In an embodiment, the material of the protective coating 40 is a metal, a metal oxide or nitride or SiO2 with a low contact angle with the immersion liquid to limit bubble inclusion. The layer may be deposited on the element 20 by e.g. evaporation, sputtering, etc.

The use of a protective coating 40 is not limited to the case where the final element 20 of the projection system PL is comprised of $CaF_2$. For example, if the final element is comprised of quartz (as typically in the case of an abschlussplatte being the final element), there may also be problems due to the dissolution or reaction of quartz with the immersion liquid 11. In this case a protective layer 40 may also be used.

The protective coating 40 should be as thin as possible to minimize transmission losses. The refractive index of the protective coating 40 can be partially varied by the deposition process and the deposition parameters. Experience gained in the deposition of EUV coatings might be usefully harnessed to optimize this process.

Figure 7:
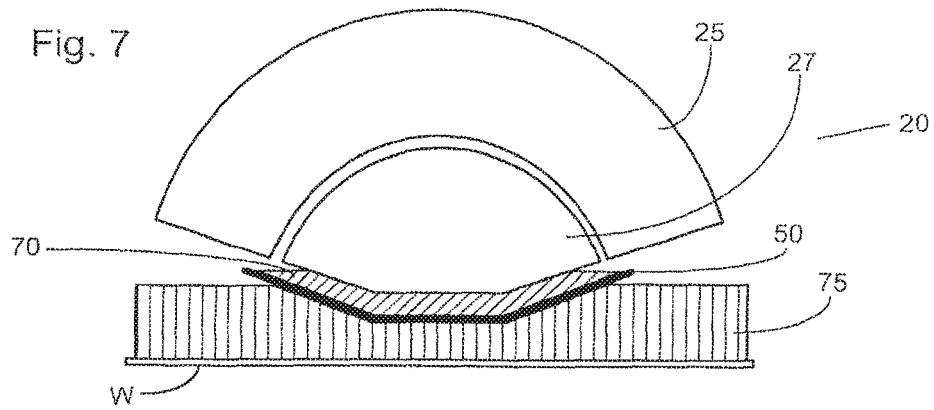
FIG. 7 depicts a final element of the projection system and a liquid supply system for providing a first immersion liquid and a second immersion liquid.

FIG. 7 illustrates a second embodiment of the present invention which is the same as the embodiment described above except as described below.

In this embodiment the liquid supply system comprises a mechanism to provide a first immersion liquid 70 which is in contact with the final element 20 of the projection system. A second immersion liquid 75 is also provided which is in contact with the substrate W.

The first immersion liquid 70 can be chosen such that it only reacts with or dissolves very slowly the material of the final element 20 or does not react at all. The second immersion liquid 75 can then be chosen because of its good optical properties without any activity limitations being placed on it because of its contact with the final element 20.

There are several ways that the two immersion liquids 70, 75 may be provided to the correct areas of the space and kept substantially apart. For example, it may be possible to provide two sets of inlets and outlets to give two flows of liquid, especially if the first and second immersion liquids are immiscible or not easily mixed.

In the embodiment illustrated in FIG. 7, a membrane 50 is provided for separating the first and second 70, 75 immersion liquids. The immersion liquids 70, 75 may then be provided separately on either side of the membrane.

In an embodiment, the membrane is between 0.1 and 5 mm thick to give the required stiffness without seriously deleteriously affecting the quality of the projection beam PB. A suitable material for making the membrane 50 is SiO2. The membrane 50 may be replaceable.

Figure 8:
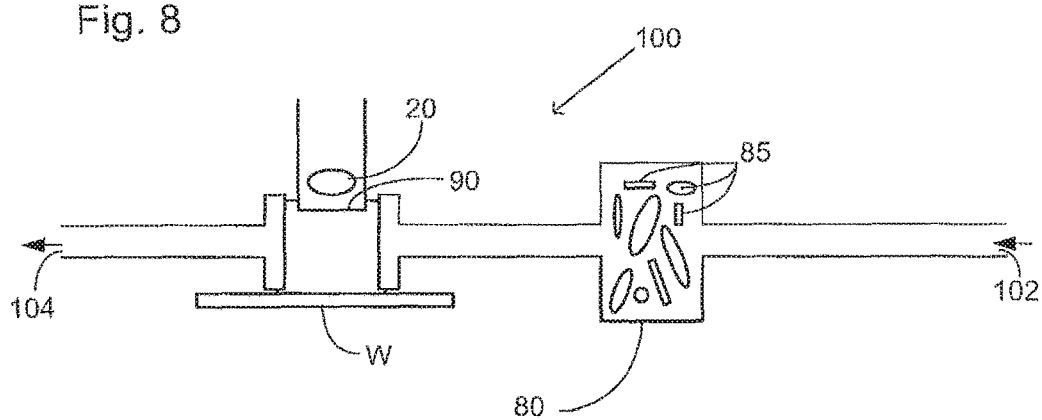
FIG. 8 depicts a liquid supply system according to an embodiment of the present invention.

FIG. 8 illustrates a liquid supply system which may be used with either of the above two embodiments. The liquid supply system 100 provides liquid from an inlet 102 to a liquid containment system, for example, for use with or used in the types of liquid supply systems illustrated in FIGS. 2 to 5. In the FIG. 8 embodiment, the immersion liquid is provided between the abschlussplatte 90 and the substrate W. Immersion liquid exits then via a drain 104.

Components of the liquid supply system, the projection system PL and the substrate table WT all come in contact with the immersion liquid. If any of those components are made of a material which can dissolve in untreated immersion liquid, and are not protected, this can deleteriously affect the lifetime of the apparatus.

In order to address this problem a sacrificial unit 80 is provided upstream of the liquid containment system (for example, seal member 12) in the liquid supply system 100. In the sacrificial unit 80, at least one sacrificial body 85 is positioned. The sacrificial body 85 is intended to dissolve in the immersion liquid to reduce the activity of the immersion liquid with materials of the components to be protected in the projection system and/or of the substrate table and/or of the liquid supply system downstream.

For example, if the final element of the projection system PL, e.g. an abschlussplatte 90 (last lens element), is comprised of quartz and is in contact with the immersion liquid, if at least one of the sacrificial bodies 85 is comprised of quartz, the immersion liquid (which may be water) can be saturated with quartz as it passes through the sacrificial unit 80 such that the immersion liquid activity with quartz once it reaches the liquid containment system and abschlussplatte 90 is reduced.

The sacrificial unit 80 may contain a plurality of sacrificial bodies which are not necessarily all of the same material. It may also be that the sacrificial bodies may be made of a different material to those materials which they are intended to protect. For example, a sacrificial body may be designed to reduce the pH of the immersion liquid to such a level that materials of components to be protected downstream of the sacrificial unit 80 do not dissolve. Alternatively, a buffer could be added to the liquid.

In an embodiment, the sacrificial bodies 85 have as large as possible a surface area to volume ratio. Example shapes are rods, tubes, etc. However, clearly any shape may be used.

Figure 9:
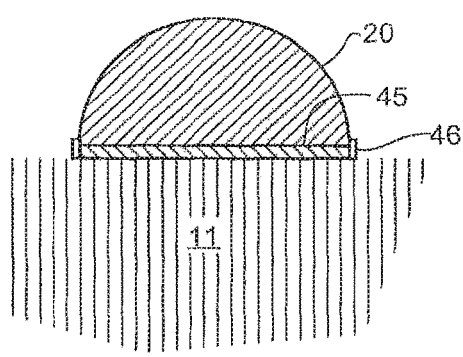
FIG. 9 depicts a protective plate applied to the final element of a projection system according to an embodiment of the invention.

In a further embodiment of the invention, shown in FIG. 9, the final element 20 of the projection system is protected by a fused silica plate 45. This plate may have a thickness in the range of from 50 µm to 5 mm and may be contact bonded or glue bonded to the final element 20. In contact bonding, no glue is used—the bonding surfaces are made smooth and clean enough to directly bond together. After bonding to the final element, the fused silica plate may be ground and polished to the desired thickness, avoiding difficulties inherent in handling a very thin plate. A liquid-tight seal 46 may be provided around the perimeter of the joint.

A seal 46 around the joint of the final element and the fused silica protective plate may be desirable where the final element and the fused silica plate are contact bonded together. Although this form of bonding can provide an exceptionally strong bond, where dissimilar materials, such as $CaF_2$ and fused silica, are bonded, temperature changes and thermal gradients may cause the bond to "breathe"-differential thermal expansion or contraction of the two materials causes them to separate until the stress is relieved. Although the bond usually reforms very quickly in the case of thermal separation, if this occurs when the final element is in contact with a liquid, e.g. during polishing or grinding of the protective layer or use of the apparatus, liquid can be drawn into the gap.

One form of seal that may be used is a layer of SiO formed by applying a suitable precursor (such as silicone fluids (i.e. comprising Si—O chains of various lengths with various hydrocarbon side-chains), tetraethyl orthosilicate, decamethyl tetrasiloxane and tetrabutyl orthosilicate) and irradiating it with DUV light to photo-convert the precursor to SiO. This form of seal has the advantage that it has a similar hardness to the fused silica plate and so polishes at a similar rate.

Another form of seal that is useful is a silicon caulk provided over a layer of titanium oxide. The titanium oxide is applied by painting a precursor onto the seal and photo-converting it to titanium oxide and acts to protect the silicone caulk from UV light during operation of the apparatus.

A further form of seal is formed by painting tetraethyl orthosilicate around the joint, which then decomposes at room temperature to form a thin layer of fused silica which forms a seal. This seal is however rather brittle so that careful handling is required.

Figure 10:
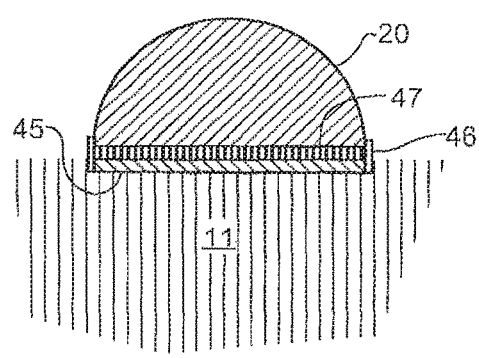
FIG. 10 depicts a protective plate and liquid layer applied to the final element of a projection system according to an embodiment of the invention.

In a variant of the FIG. 9 arrangement shown in FIG. 10, a liquid 47, such as oil, is provided between the last lens element 20 and the protective plate 45. In an embodiment, the liquid 47 has a refractive index as close as possible to that of the immersion liquid 11, which may be water, but is not damaging to the material of the final lens element 20, which may be $CaF_2$. This enables the protective plate to be interchangeable by substantially reducing the requirements on the accuracy with which the protective plate 45 must be positioned as the fluids above and below it have similar refractive indices.

Figure 11:
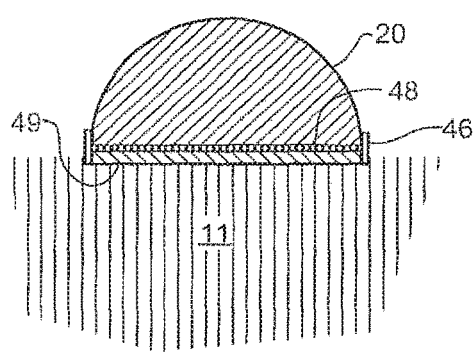
FIG. 11 depicts a two layer protective coating applied to the final element of a projection system according to an embodiment of the invention.

A further variant, shown in FIG. 11, uses a two layer protective coating, made up of inner layer 48 and outer layer 49. It may be very difficult to form a layer of protective coating without pinholes. Even the smallest pinhole in a protective coating applied to a $CaF_2$ body allows dissolution of the $CaF_2$ body when immersed in liquid (e.g., water), causing cavitation which is extremely deleterious to the optical properties of the element. By the use of a two layer protective coating, it can be arranged that the pinholes in one layer do not match up with the pinholes in the other layer so that there is no through path in the protective layer. It can best be ensured that the pinholes of the two layers do not match up by applying the two protective layers by different methods.

An embodiment of the invention has a first layer 48 of SiO applied by sputtering and a second layer 49 applied by spin coating a precursor and photo-converting the precursor to SiO. This method may be more effective than sputtering two layers of SiO since the pinholes in the second sputtered layer have a tendency to line up with those in the first layer. Surprisingly, the spin coating and photo-conversion method may provide a layer of bulk SiO rather than porous SiO. A layer formed by spin-coating a precursor and then photo-converting it to SiO may also be used on its own as a seal layer.

The precursor used to form protective layer 49 may be any suitable fluid of, or containing, organo-silicon compounds. Suitable examples are silicone fluids (i.e. comprising Si—O chains of various lengths with various hydrocarbon side-chains), tetraethyl orthosilicate, decamethyl tetrasiloxane and tetrabutyl orthosilicate. The material may be chosen to have a desired viscosity to enable a suitably even layer to be provided by spin coating. Solvents, such as volatile organic solvents, may be used to adjust the viscosity if necessary.

Photo-conversion of the precursor to SiO can be achieved with irradiation by DUV light of various wavelengths, e.g. 184 nm or 172 nm, at a rate determined to avoid any deleterious effects that might be induced by thermal gradients in the element.

Each of the two layers of the protective coating may have a thickness in the range of 50 to 200 nm.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

In an embodiment, there is provided a lithographic projection apparatus arranged to project a pattern from a patterning device onto a substrate using a projection system and having a liquid supply system configured to at least partly fill a space between the projection system and the substrate with a liquid, wherein an element of the projection system through which the pattern is projected has, on a surface configured to be in contact with the liquid, a protective coating which is substantially insoluble in the liquid.

In an embodiment, the protective coating has a thickness equal to or greater than 5 nm. In an embodiment, the protective coating has a thickness less than or equal to 500 nm. In an embodiment, the protective coating is a metal, a metal oxide or nitride, $CaF_2$, SiO, $SiO_2$ or any combination of these materials. In an embodiment, the protective coating is a fused silica plate. In an embodiment, the fused silica plate has a thickness in the range of from 50 µm to 5 mm. In an embodiment, the fused silica plate is attached to the element by contact bonding without glue. In an embodiment, the protective coating has two distinct layers. In an embodiment, the two distinct layers are of the same material but have been formed by different methods. In an embodiment, one of the two distinct layers is formed by sputtering and the other of the two distinct layers is formed by spin coating a precursor onto the element and irradiating the precursor with ultraviolet light. In an embodiment, the protective coating is formed by spin coating a precursor onto the element and irradiating the precursor with ultraviolet light. In an embodiment, the precursor comprises an organo-silicon compound. In an embodiment, the precursor comprises one or more compounds selected from the group comprising silicone fluids, tetraethyl orthosilicate, decamethyl tetrasiloxane and tetrabutyl orthosilicate.

In an embodiment, there is provided a lithographic projection apparatus arranged to project a pattern from a patterning device onto a substrate using a projection system and having a liquid supply system configured to at least partly fill a space between the projection system and the substrate with a liquid, wherein the liquid supply system is configured to provide a first liquid in the space in contact with an element of the projection system through which the pattern is projected and to provide a second liquid in the space in contact with the substrate.

In an embodiment, the liquid supply system further comprises a membrane configured to separate the first and second liquids. In an embodiment, the membrane is quartz. In an embodiment, the membrane has a thickness in the range of 0.1 to 5 mm. In an embodiment, the element comprises $CaF_2$. In an embodiment, elements of the projection system other than the element are made of a material other than $CaF_2$. In an embodiment, the element comprises a first and a second component, both components comprising $CaF_2$, wherein the projected pattern passes through the first component before passing through the second component. In an embodiment, the first and second components each have crystal axes which are aligned such that intrinsic birefringence of the first component is compensated for by intrinsic birefringence of the second component. In an embodiment, the first and second components are concentric. In an embodiment, the second component is positioned substantially within a recess in the first component.

In an embodiment, there is provided a lithographic projection apparatus arranged to project a pattern from a patterning device onto a substrate using a projection system and having a liquid supply system configured to at least partly fill a space between the projection system and the substrate with a liquid, wherein an element of the projection system through which the pattern is to be projected and configured to be at least in part in contact with the liquid, comprises first and second components of $CaF_2$, $SiO_2$ or a combination of both materials, the components being arranged such that the projected pattern passes through the first component before passing through the second component.

In an embodiment, the first and second components each have crystal axes which are aligned such that intrinsic birefringence of the first component is compensated for by intrinsic birefringence of the second component. In an embodiment, the first and second components are concentric. In an embodiment, the second component is positioned substantially within a recess in the first component. In an embodiment, elements of the projection system other than the element are made of a material other than $CaF_2$.

In an embodiment, there is provided a lithographic projection apparatus arranged to project a pattern from a patterning device onto a substrate using a projection system and having a liquid supply system configured to at least partly fill a space between the projection system and the substrate with a liquid, wherein the liquid supply system comprises a sacrificial body, in the liquid upstream of the space, configured to dissolve in the liquid to reduce the rate of dissolution of a component of (a) the projection system, (b) the substrate table, (c) the liquid supply system, or any combination of (a), (b), and (c).

In an embodiment, the sacrificial body is made of substantially the same material as the component. In an embodiment, the sacrificial body comprises quartz or $CaF_2$. In an embodiment, the sacrificial body has a shape with a high surface area to volume ratio.

In an embodiment, there is provided a device manufacturing method comprising projecting a patterned beam of radiation onto a substrate through a liquid provided in a space between an element of a projection system and the substrate, wherein a surface of the element in contact with the liquid comprises a protective coating which is substantially insoluble in the liquid.

In an embodiment, the protective coating has a thickness in the range of from 5 nm to 500 nm. In an embodiment, the protective coating is a metal, a metal oxide or nitride, $CaF_2$, SiO, $SiO_2$ or any combination of these materials. In an embodiment, the protective coating is a fused silica plate having a thickness in the range of from 50 µm to 5 mm. In an embodiment, the fused silica plate is attached to the element by contact bonding without glue. In an embodiment, the protective coating has two distinct layers. In an embodiment, the two distinct layers are of the same material but have been formed by different methods. In an embodiment, one of the two distinct layers is formed by sputtering and the other of the two distinct layers is formed by spin coating a precursor onto the element and irradiating the precursor with ultraviolet light. In an embodiment, the protective coating is formed by spin coating a precursor onto the element and irradiating the precursor with ultraviolet light.

In an embodiment, there is provided a device manufacturing method comprising projecting a patterned beam of radiation onto a substrate through a first liquid and a second liquid provided in a space between an element of a projection system and the substrate, wherein the first liquid is in contact with the element and the second liquid is in contact with the substrate.

In an embodiment, a membrane separates the first and second liquids. In an embodiment, the membrane is quartz. In an embodiment, the membrane has a thickness in the range of 0.1 to 5 mm. In an embodiment, the first liquid is immiscible in the second liquid.

In an embodiment, there is provided a device manufacturing method comprising projecting a patterned beam of radiation onto a substrate through a liquid provided in a space between an element of a projection system and the substrate, wherein the element is at least in part in contact with the liquid and comprises first and second components of $CaF_2$, $SiO_2$ or a combination of both materials, the components being arranged such that the patterned beam of radiation passes through the first component before passing through the second component.

In an embodiment, elements of the projection system other than the element are made of a material other than $CaF_2$. In an embodiment, the first and second components each have crystal axes which are aligned such that intrinsic birefringence of the first component is compensated for by intrinsic birefringence of the second component. In an embodiment, the first and second components are concentric. In an embodiment, the second component is positioned substantially within a recess in the first component.

In an embodiment, there is provided a device manufacturing method comprising projecting a patterned beam of radiation onto a substrate through a liquid provided in a space between an element of a projection system and the substrate, wherein a sacrificial body, in the liquid upstream of the space, dissolves in the liquid to reduce the rate of dissolution of a component of (a) the projection system, (b) a substrate table holding the substrate, (c) a liquid supply system providing the liquid, or any combination of (a), (b), and (c).

In an embodiment, the sacrificial body is made of substantially the same material as the component. In an embodiment, the sacrificial body comprises quartz or $CaF_2$. In an embodiment, the sacrificial body has a shape with a high surface area to volume ratio.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, to those types mentioned above.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
a projection system configured to project a pattern from a patterning device onto a substrate; and
a liquid supply system configured to at least partly fill a space between the projection system and the substrate with a liquid, the liquid supply system configured to provide in the liquid upstream of the space and to be carried by the liquid to the space, a material to reduce the rate of dissolution of a component of (a) the projection system, (b) the substrate table, (c) the liquid supply system, or any combination selected from (a), (b), and (c).

2. The apparatus of claim 1, wherein the material is essentially the same material as the component.

3. The apparatus of claim 1, wherein the material comprises quartz or $CaF_2$.

4. The apparatus of claim 1, wherein the liquid supply system comprises a body, in the liquid upstream of the space, configured to dissolve in the liquid to provide the material to reduce the rate of dissolution.

5. The apparatus of claim 4, wherein the body has a shape with a high surface area to volume ratio.

6. A device manufacturing method comprising projecting a patterned beam of radiation onto a substrate through a liquid provided in a space between an element of a projection system and the substrate, and providing in the liquid upstream of the space and for carrying by the liquid to the space, a material to reduce the rate of dissolution of a component of (a) the projection system, (b) a substrate table holding the substrate, (c) a liquid supply system providing the liquid, or any combination selected from (a), (b), and (c).

7. The method of claim 6, wherein the material is essentially the same material as the component.

8. The method of claim 6, wherein the material comprises quartz or $CaF_2$.

9. The method of claim 6, wherein a body, in the liquid upstream of the space, dissolves in the liquid to provide the material to reduce the rate of dissolution.

10. The method of claim 9, wherein the body has a shape with a high surface area to volume ratio.

11. A lithographic projection apparatus, comprising:
a projection system configured to project a beam of radiation onto a radiation-sensitive substrate, the projection system comprising an optical element through which the beam is projected, the optical element having a bottom surface and a side surface with a horizontal direction component; and
a liquid confinement member configured to constrain liquid within a space between the projection system and the substrate, the liquid confinement member having a surface facing the side surface of the optical element, wherein a gap between the surface of the liquid confinement member and the side surface of the optical element allows liquid to flow therein,
wherein the side surface has a protective coating arranged to have liquid in contact therewith in the gap.

12. The apparatus of claim 11, wherein the protective coating has a thickness equal to or greater than 5 nm.

13. The apparatus of claim 11, wherein the side surface extends at an oblique angle to the bottom surface.

14. The apparatus of claim 11, wherein the protective coating has a thickness less than or equal to 500 nm.

15. The apparatus of claim 11, wherein the protective coating is a metal, a metal oxide or nitride, $CaF_2$, SiO, $SiO_2$ or any combination selected from these materials.

16. The apparatus of claim 11, wherein the protective coating has two distinct layers.

17. The apparatus of claim 11, wherein the optical element comprises $CaF_2$.

18. The apparatus of claim 11, wherein the protective coating is a fused silica layer.

19. The apparatus of claim 18, wherein the fused silica layer has a thickness in the range of from 50 μm to 5 mm.

20. The apparatus of claim 11, wherein the protective coating is formed by spin coating a precursor onto the optical element and irradiating the precursor with ultraviolet light.

* * * * *